(12) United States Patent
Kuboi et al.

(10) Patent No.: US 9,881,107 B2
(45) Date of Patent: Jan. 30, 2018

(54) SIMULATION METHOD, SIMULATION PROGRAM, PROCESSING APPARATUS, SIMULATOR, AND DESIGN METHOD

(71) Applicant: Sony Semiconductor Solutions Corporation, Kanagawa (JP)

(72) Inventors: Nobuyuki Kuboi, Kanagawa (JP); Takashi Kinoshita, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 652 days.

(21) Appl. No.: 14/522,041

(22) Filed: Oct. 23, 2014

(65) Prior Publication Data
US 2015/0149131 A1 May 28, 2015

(30) Foreign Application Priority Data
Nov. 25, 2013 (JP) .................................. 2013-242932

(51) Int. Cl.
*G06F 17/50* (2006.01)
(52) U.S. Cl.
CPC ................................ *G06F 17/5009* (2013.01)
(58) Field of Classification Search
CPC .................................................. G06F 17/5018
USPC ................................................................ 703/2
See application file for complete search history.

(56) References Cited

U.S. PATENT DOCUMENTS

| 6,709,917 B2 * | 3/2004 | Panda | H01L 21/3065 257/E21.218 |
| 7,687,303 B1 * | 3/2010 | Sukharev | H01L 21/31116 257/E21.17 |
| 8,969,841 B2 * | 3/2015 | Smith | B82Y 10/00 250/504 R |

FOREIGN PATENT DOCUMENTS

JP 2803649 B2 7/1998

OTHER PUBLICATIONS

M. Tuda et al., "Numerical Study of the etch anisotrophy in low-pressure, high-density plasma etching," Journal of Applied Physics, vol. 81 (2), pp. 960-967, Jan. 15, 1997.

* cited by examiner

*Primary Examiner* — Andy Ho
(74) *Attorney, Agent, or Firm* — Michael Best & Friedrich LLP

(57) ABSTRACT

A simulation method includes acquiring a processing condition for performing predetermined processing on a processing target with use of plasma, calculating a solid angle corresponding to a field-of-view region through which plasma space is viewable from a predetermined evaluation point in the predetermined evaluation point on a surface of the processing target based on the processing condition, and calculating an incident radical amount entering the evaluation point by a flux method with use of a function which takes a reaction probability between the solid angle and the evaluation point of a radical entering the evaluation point as an argument.

19 Claims, 11 Drawing Sheets

SIMULATION METHOD, SIMULATION PROGRAM, PROCESSING APPARATUS, SIMULATOR, AND DESIGN METHOD

CROSS REFERENCE TO RELATED APPLICATIONS

This application claims the benefit of priority under 35 U.S.C. §119 from Japanese Priority Patent Application JP 2013-242932 filed Nov. 25, 2013, the entire contents of each which is incorporated herein by reference.

BACKGROUND

The present technology relates to a simulation method and a simulation program for predicting a processing state of a processing target, and to a processing apparatus, a simulator, and a design method that utilize the simulation method.

In a plasma etching simulation of a semiconductor, an incident radical amount and an incident ion amount entering a pattern are calculated, and an etching rate is derived by solving a reaction at a processing surface with use of the calculation result. Shape development is calculated from the etching rate. In the calculation of the incident radical amount, two calculations are made to determine a "direct component" which enters a processing surface element from immediately above the pattern and an "indirect component" which is once reemitted from other processing surfaces and enters the processing surface element. The calculation of the indirect component is particularly important factor for predicting a processing shape.

As a method of calculating the indirect component, a method that uses Monte Carlo method and a method that uses a flux method have been known. Although the former can accurately reflect the physics, more test particles are needed as an aspect ratio of a target pattern become higher, so that a calculation time becomes enormous. Meanwhile, although the latter does not accurately reflect the physics, when modeling is performed well, the latter reduces a calculation cost and can be a useful calculation technique.

As a typical method of calculating the flux method, for example, a method described in Tuda et al., J. Appl. Phys. 81 (1997) 960 (hereinafter, referred to as Non-Patent Document 1) has been known. This method assumes that the indirect component is reemitted only once from other elements and is calculated by using an angle ($\varphi$) made by a vector connecting normal vectors of two surface elements and element centroids, a distance (r) between the centroids, a residual flux ($(1-S)\Gamma$), and a surface element area (dS) as an argument.

Meanwhile, a calculation technique that uses the flux method has been also proposed in Japanese patent No. 2803649 (hereinafter, referred to as Patent Document 1). This technique is a calculation technique limiting a pattern to an axisymmetric hole shape, and integrates and derives a reemission from a minute element on a circumference cut along a surface (X-Y plane) perpendicular to a cylindrical axis with respect to an angle ($\theta$) made by an X-axis and the minute element on the circumference.

SUMMARY

However, since the method described in Non-Patent Document 1 assumes that the indirect component is reemitted only once, in a case of a calculation of a high aspect ratio (AR) so that a plurality of times of reemissions are made, errors in a calculation of an indirect flux, especially errors in a shape calculation, may increase. Further, the calculation uses its own and other information, so that a calculation load is proportional to the square of the surface element. Therefore, as the aspect ratio increases, the calculation load increases rapidly.

Meanwhile, since the method described in Patent Document 1 is the calculation technique limiting a pattern shape to an axisymmetric cylindrical shape, when a target pattern is formed as an inequiaxial structure, the method lacks versatility with respect to the shape calculation in a case where a peripheral opening ratio differs in the left and right regions of the target pattern and has a limitation in use.

In view of the circumstances as described above, it is desirable to provide a simulation method and a simulation program capable of predicting a radical amount with high precision while reducing a calculation load, and a processing apparatus, a simulator, and a design method that utilize the simulation method.

According to an embodiment of the present technology, there is provided a simulation method including acquiring a processing condition for performing predetermined processing on a processing target with use of plasma.

The simulation method calculates a solid angle corresponding to a field-of-view region through which plasma space is viewable from a predetermined evaluation point in the predetermined evaluation point on a surface of the processing target based on the processing condition.

The simulation method calculates an incident radical amount entering the evaluation point by a flux method with use of a function which takes a reaction probability between the solid angle and the evaluation point of a radical entering the evaluation point as an argument.

According to an embodiment of the present technology, there is provided a simulation program that causes an information processing apparatus to execute calculation, the calculation including: calculating a solid angle corresponding to a field-of-view region through which plasma space is viewable from a predetermined evaluation point in the predetermined evaluation point on a surface of a processing target based on a processing condition for performing predetermined processing on the processing target with use of plasma; and calculating an incident radical amount entering the evaluation point by a flux method with use of a function which takes a reaction probability between the solid angle and the evaluation point of a radical entering the evaluation point as an argument.

According to an embodiment of the present technology, there is provided a processing apparatus including a processing unit, a detecting unit, a simulator, and a control unit.

The processing unit performs predetermined processing on a processing target with use of plasma.

The detecting unit monitors a plasma state in the processing unit.

The simulator simulates the predetermined processing.

The control unit controls the processing unit based on a simulation result by the simulator.

The simulator includes an input unit, a calculation unit, and an output unit.

The input unit is configured to acquire a processing condition for performing the predetermined processing.

The calculation unit is configured to calculate a solid angle corresponding to a field-of-view region through which plasma space is viewable from a predetermined evaluation point in the predetermined evaluation point on a surface of the processing target based on the processing condition, and calculate an incident radical amount entering the evaluation point by a flux method with use of a function which takes a reaction probability between the solid angle and the evaluation point of a radical entering the evaluation point as an argument.

The output unit outputs, to the control unit, a correction signal of the processing condition generated based on the incident radical amount.

According to an embodiment of the present technology, there is provided a simulator including an input unit and a calculation unit.

The input unit is configured to acquire a processing condition for performing predetermined processing on a processing target with use of plasma.

The calculation unit is configured to calculate a solid angle corresponding to a field-of-view region through which plasma space is viewable from a predetermined evaluation point in the predetermined evaluation point on a surface of the processing target based on the processing condition, and calculate an incident radical amount entering the evaluation point by a flux method with use of a function which takes a reaction probability between the solid angle and the evaluation point of a radical entering the evaluation point as an argument.

According to an embodiment of the present technology, there is provided a design method including acquiring a processing condition for performing predetermined processing on a processing target with use of plasma.

The design method calculates a solid angle corresponding to a field-of-view region through which plasma space is viewable from a predetermined evaluation point in the predetermined evaluation point on a surface of the processing target based on the processing condition.

The design method calculates an incident radical amount entering the evaluation point by a flux method with use of a function which takes a reaction probability between the solid angle and the evaluation point of a radical entering the evaluation point as an argument.

The design method evaluates a processing shape predicted based on the incident radical amount.

The design method changes at least one of the processing condition and a layout in a chip based on an evaluation result of the processing shape.

As described above, according to embodiments of the present technology, it is possible to predict a radical amount with high precision while reducing a calculation load.

It should be noted that the present technology is not limited to the effects described here and may achieve any one of the effects described in the present disclosure.

These and other objects, features and advantages of the present disclosure will become more apparent in light of the following detailed description of best mode embodiments thereof, as illustrated in the accompanying drawings.

DETAILED DESCRIPTION OF EMBODIMENTS

Hereinafter, embodiments according to the present technology will be described with reference to the drawings.

First Embodiment

Figure 1:
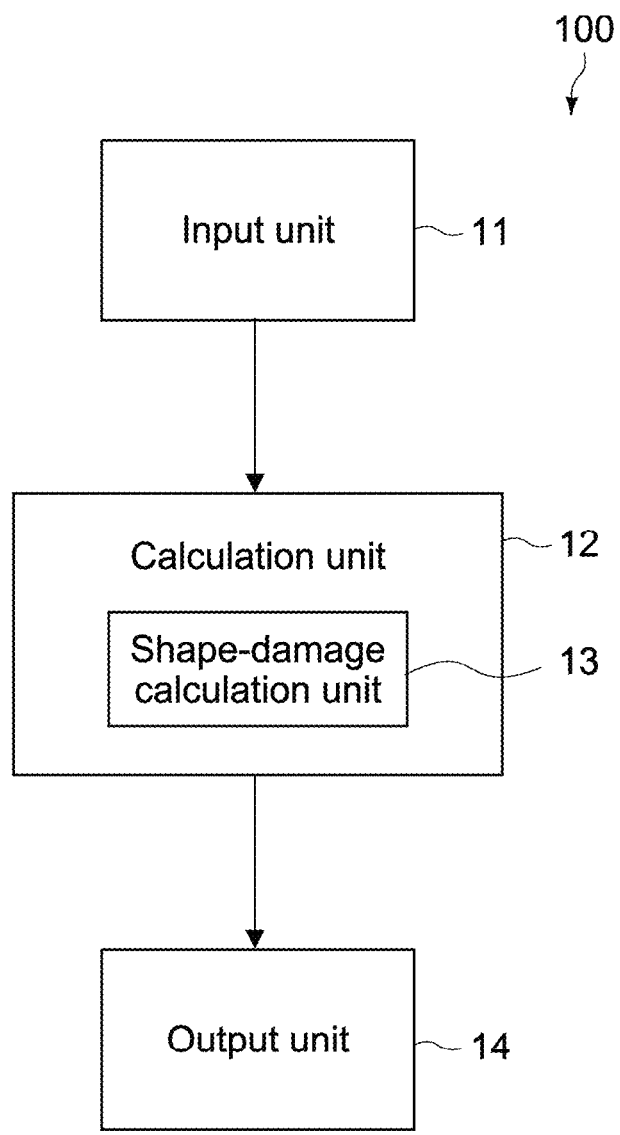
FIG. 1 is a schematic diagram showing a configuration example of a simulator according to a first embodiment of the present technology.

FIG. 1 shows a configuration example of a simulator (an information processing apparatus) according to a first embodiment of the present technology. Hereinafter, a configuration of a simulator 100 will be described.
[Simulator]
The simulator 100 according to the present embodiment includes an input unit 11, a calculation unit 12, and an output unit 14. The input unit 11 is configured to acquire a processing condition for performing predetermined processing on a processing target and input the processing condition to a calculation unit 12. The calculation unit 12 includes a shape-damage calculation unit 13. The shape-damage calculation unit 13 calculates, for example, shape development, damage and the like of the processing target, based on the processing condition inputted through the input unit 11, by a simulation method which will be described later.

The shape-damage calculation unit 13 may be configured of hardware and achieve a calculation process which will be described later or may use a predetermined simulation program (software) to execute the calculation process. In this case, the shape-damage calculation unit 13 is configured, for example, of a calculation apparatus such as a CPU (Central Processing Unit), and reads the simulation program from outside and executes the program, thereby executing the calculation.

The simulation program may be stored, for example, in a database (not shown), a memory unit such as a ROM (Read Only Memory) provided separately. In this case, the simulation program may be implemented in advance, for example, in the database, the separately-provided memory unit and the like. Alternatively, the simulation program may be implemented from the outside, for example, to the database, the separately-provided memory unit and the like. When the simulation program is acquired from the outside, the simulation program may be distributed from a medium such as an optical disk and a semiconductor memory, or alternatively, may be downloaded through a transmission means such as Internet.

The output unit 14 is configured to output a simulation result of the predetermined processing that is calculated by the calculation unit 12. The calculation unit 14 may output, for example, information such as the processing condition and a parameter used for the calculation, together with the simulation result of the processing. The output unit 14 is configured, for example, of one of apparatuses such as a display apparatus that displays the simulation result, a printing apparatus that prints out the simulation result, and a recording apparatus that records the simulation result, or an appropriate combination thereof. Although an example in which the simulator includes the output unit 14 is described in the present embodiment, the present technology is not limited to this example, and the output unit 14 may be provided outside the simulator.

The simulator 100 may further include a database unit that stores various parameters necessary for the calculation process by the shape-damage calculation unit 13. Alternatively, such a database unit may be provided outside the simulator. The database unit does not need to be provided when the various parameters necessary for the calculation process is appropriately inputted from the outside.

The simulator 100 according to the present embodiment acquires, by the flux method, a radical amount entering a processing region of a surface of the processing target for performing predetermined processing on the processing target.

(Reference Technique)

Figure 2:
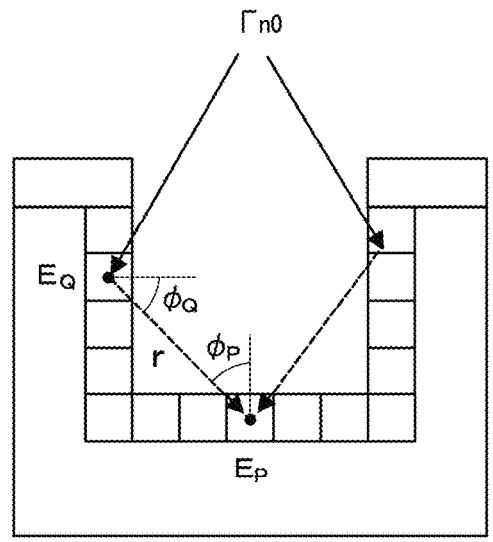
FIG. 2 is a conceptual diagram describing a reference technique.

As a typical method of calculating the flux method, for example, a method described in Non-Patent Document 1 has been known. This method assumes that the indirect component is reemitted only once from other elements and is calculated by using angles ($\varphi_P$, $\varphi_Q$) made by a vector connecting normal vectors of two surface elements ($E_P$, $E_Q$) and element centroids, a distance (r) between the centroids, a residual flux ($(1-S)\Gamma$), and a surface element area (dS) as an argument, as shown in FIG. 2 and the following Equation (1).

$$\int_{Profile} \frac{[1 - Sn\ (Q)]\Gamma n(Q)\cos\phi_P \cdot \cos\phi_Q}{2r} ds \quad (1)$$

Figure 3:
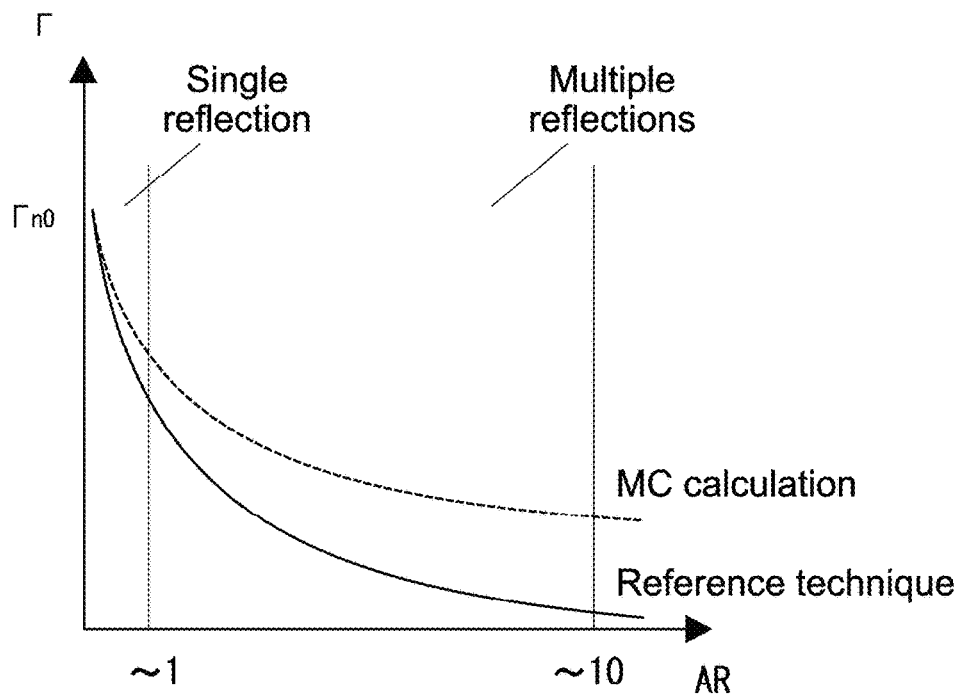
FIG. 3 is a diagram showing a calculation result of a flux amount by the reference technique.

However, this method assumes that the indirect component is reemitted only once. Accordingly, in a case of a calculation of a high aspect ratio (AR) so that a plurality of times of reemissions is made, errors in a calculation of an indirect flux, especially errors in a shape calculation, may increase, compared with a calculation by Monte Carlo method as shown in FIG. 3. Further, the calculation uses its own and other information, so that a calculation load is proportional to the square of the surface element. Therefore, as the aspect ratio increases, the calculation load increases rapidly.

Accordingly, in the present embodiment, to allow for predicting a radical amount with high precision while reducing a calculation load, the radical amount is calculated by a method described below.

[Simulation Model]

In the present embodiment, the radical amount is calculated by the flux method with consideration given to a plurality of times of pseudo-reemission (convection, stagnation effect) by using a solid angle $\Omega$ (t) depending on a processing time t and an effective surface reaction probability Sn as arguments.

When the processing target is processed with plasma etching, the processing region of the processing target corresponds to an opening pattern which is an opening region of a resist mask (hereinafter simply referred to as a pattern). Hereinafter, a method of calculating a radical flux will be described by taking plasma etching process as an example.

(1) Method of Calculating Flux

The simulation method according to the present embodiment includes the following calculation process. The calculation process is stored in the calculation unit (shape-damage calculation unit 13) of the simulator 100 as a simulation program.

(a) A processing condition for performing predetermined processing on the processing target with use of plasma is acquired.

(b) A solid angle corresponding to a field-of-view region through which plasma space is viewable from a predetermined evaluation point in the predetermined evaluation point on a surface of the processing target is calculated based on the processing condition.

(c) An incident radical amount entering the evaluation point by a flux method with use of a function which takes a reaction probability between the solid angle and the evaluation point of a radical entering the evaluation point as an argument is calculated.

(a) Acquisition of Processing Condition

Figure 4:
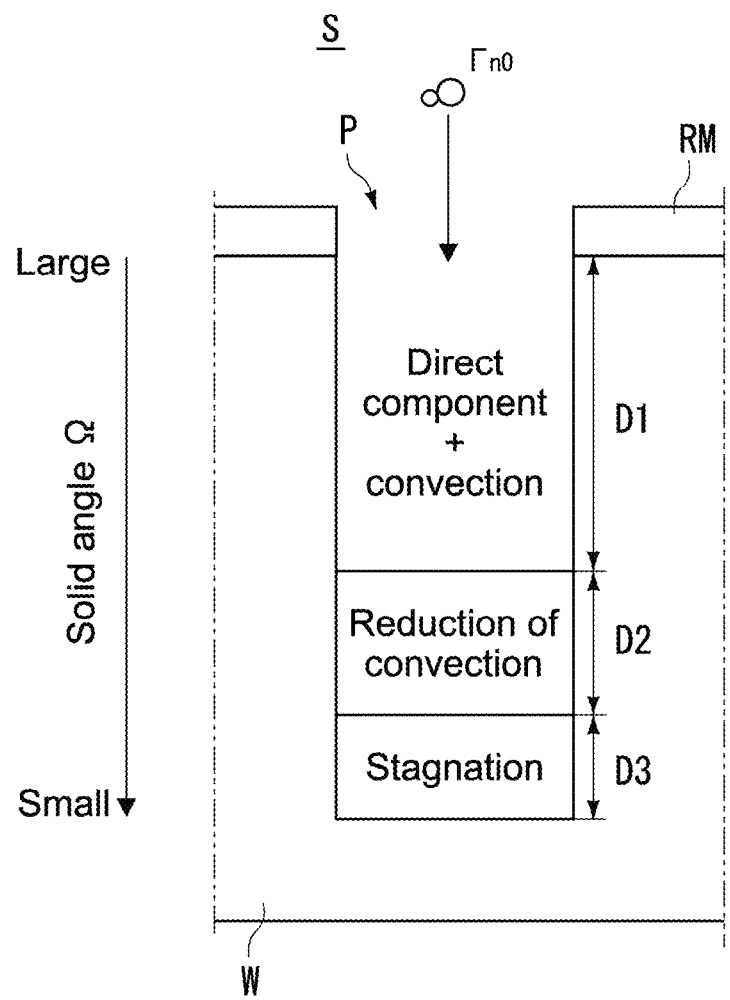
FIG. 4 is a conceptual diagram of a flux model describing a simulator method according to the first embodiment of the present technology.
Figure 5:
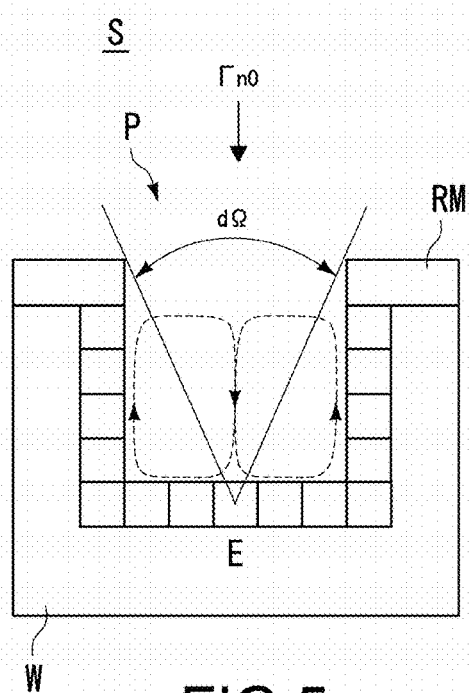
FIG. 5 is a conceptual diagram describing the simulator method.

FIGS. 4 and 5 are conceptual diagrams of flux models according to the present embodiment. Herein, a semiconductor wafer such as a silicon wafer (hereinafter referred to as a wafer W) as the processing target will be described as an example.

A surface of the wafer W is coated with $SiO_2$ film. On the surface of $SiO_2$ film, a resist mask RM having a predetermined opening pattern is formed. A surface region of the wafer W corresponding to an opening of the resist mask RM is formed as a processing region. In the processing region of the wafer W, an etching pattern P whose shape is changed over time in accordance with the progress of the etching (hereinafter referred to as a pattern P) is formed.

In the present embodiment, the predetermined processing corresponds to plasma etching process. The processing condition includes a thickness, an opening shape, and an etching condition of the resist mask RM (such as type and flow rate of gas, pressure, Vpp, wafer temperature) and the like.

(b) Calculation of Solid Angle

The simulation method according to the present embodiment separates the surface of the pattern P into a plurality of evaluation points E and calculates an incident flux amount for each evaluation point E. As shown in FIG. 5, the evaluation points E are set as minute rectangular cells virtually-allocated on the surface of the pattern P.

A solid angle $d\Omega$ represents a solid angle corresponding to a field-of-view region through which plasma space S is viewable in one target evaluation point E from the evaluation point E. The solid angle $d\Omega$ changes in accordance with a shape of the pattern P that momentarily changes. Typically, a value of the solid angle $d\Omega$ decreases as a depth of the pattern P increases. An initial value of the solid angle $d\Omega$ is determined by the thickness, the opening shape, and an opening size (opening diameter) of the resist mask RM.

(c) Calculation of Incident Radical Amount

The pattern P is etched in a depth direction by a surface reaction with a radical entering from the plasma space S. Accordingly, as shown in FIG. 4, the radical flux entering the pattern P is defined by being separated into three regions D1, D2, and D3 with respect to the solid angle $d\Omega$ (pattern depth).

A shallow region of the pattern P, that is, the region D1 exhibits an effect of a direct component and convection of pseudo-gas by the direct component. In this case, the "direct component" represents a component of the radical flux which directly reaches the surface of the pattern P from the plasma space S. Moreover, the "convection" represents a fluid gas state including the radical reflected on a side wall (inner wall) of the pattern one or a plurality of times, or the radical reemitted from the side wall (inner wall) of the pattern. Then, it is considered that in a lower layer of the region D1, the region D2 having lower gas density than the region D1 is provided, and that, at further depths, the "stagnant" region D3 where the gas is kept stagnant is provided.

Functions for representing fluxes in the regions D1, D2, and D3 are set as F1, F2, and F3, respectively. When an amount of the radical flux immediately before entering the pattern P is set as $\Gamma_n0$, a radical flux $\Gamma$ at some depths in the pattern (corresponding to the solid angle $d\Omega$) is expressed according to the following Equations as a function of two parameters: $d\Omega(t)$ that momentarily changes (where $0 \le d\Omega \le 2\pi$) and the effective surface reaction probability Sn.

$$\frac{\Gamma n(d\Omega, Sn)}{\Gamma n0} = F1(d\Omega, Sn) + F2(d\Omega, Sn) \quad d\Omega > L \quad (2)$$

$$\frac{\Gamma n(d\Omega, Sn)}{\Gamma n0} = F3 = const. \quad d\Omega \le L \quad (3)$$

In this case, L represents a solid angle corresponding to a boundary between the regions D1, D2 and the region D3. L represents, for example, a relatively small solid angle corresponding to equal to or less than 10 of an aspect ratio, and in a case of a hole pattern, it has a size of 0.03, for example. The above Equations (2) and (3) are mutually continuous at $d\Omega=L$.

When the above Equation (2) is expressed in further detail, two parameters m1(Sn) and m2(Sn) depending on the effective surface reaction probability Sn are used to be expressed as follows.

$$\frac{\Gamma n(d\Omega, Sn)}{\Gamma n0} = \left[\frac{1}{2\pi}d\Omega + m1(Sn)d\Omega^{m2(Sn)}\right] \quad d\Omega > L \quad (4)$$

$$\frac{\Gamma n(d\Omega, Sn)}{\Gamma n0} = const. \quad d\Omega \le L \quad (5)$$

In this case, it is assumed that m1(Sn) and m2(Sn) are smaller than one, and are the parameters depending on the effective surface reaction probability Sn, and are expressed by polynomial equations of the second order or lower of Sn. Coefficients m1(Sn) and m2(Sn) are coefficients determined by a size of the solid angle $d\Omega$. The coefficients m1(Sn) and m2(Sn) may be calculation values based on an arbitrary function. Alternatively, various solid angles $d\Omega$ and a database of m1 and m2 with respect to the surface reaction probability Sn are prepared in advance, and the database may be used to search and interpolate optimal m1 and m2.

The coefficients m1(Sn) and m2(Sn) are added to mathematically express the convection of pseudo-gas in the pattern P and have significance as a correction parameter for reflect increase in an incident flux amount in a high aspect ratio region so that a plurality of times of reemissions are made from the processing surface.

In a case where the solid angle is equal to or less than a predetermined threshold value ($d\Omega \le L$) for calculating an incident radical amount, Equation (3) or (5) means calculating, as the incident radical amount, the radical amount obtained when the solid angle is the threshold value ($d\Omega=L$). That is, in the present embodiment, when the solid angle is equal to or less than the predetermined threshold value, it is considered that the flux is constant as a pseudo-stagnation effect. The above threshold value L is not particularly limited, but can be set to L=0.03, for example.

The first right side term in Equation (4) corresponds to a direct component F1. Moreover, the second right side term in Equation (4) corresponds to terms F2 and F3 expressing an indirect component and decrease in the indirect component.

It is considered that within the pattern P, density is significantly higher than immediately above the pattern P by entered gas, gas which remains unconsumed at the surface reaction, and the presence of a reaction product generated, which leads to non-Knudsen transport. The non-Knudsen transport represents, in short, a state where a mean free path of the gas is longer than the characteristic length of the pattern P, or the gas does not collide within the pattern P. In consideration of the state, within the pattern P, it is expressed as a term (exponential function) slower than the reduction effect of the direct component [m2(Sn)<1] and depending on the solid angle $d\Omega$.

Equation (4) can be further transformed into the following Equation (6).

$$\frac{\Gamma n(d\Omega, Sn)}{\Gamma n0} = m1(Sn)\left[\frac{1}{2\pi} + d\Omega^{m2(Sn)}\right] \quad d\Omega > L \quad (6)$$

With regard to the first right side term in Equation (6), the boundary where the direct component and the indirect component are switched is $d\Omega \sim 1$, so that the first right side term is provided to be proportional to the averaged direct component set as $d\Omega=1$.

Figure 6:
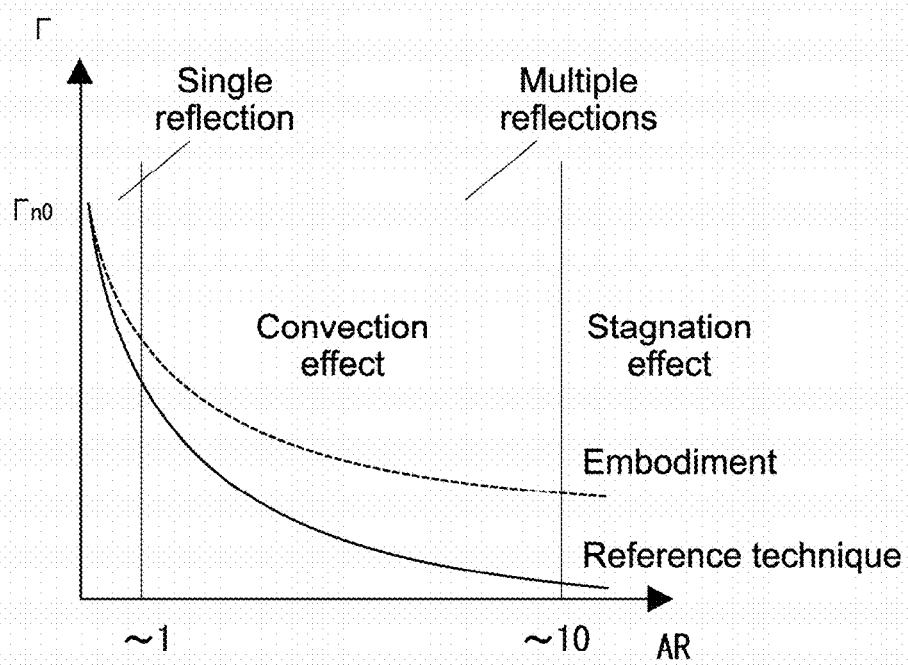
FIG. 6 is a diagram showing a comparison between a calculation result of a flux amount by the simulator method and a calculation result of the flux amount by the reference technique.

FIG. 6 shows a comparison between a flux value calculated by Equation (6) and a flux value calculated by using the above reference technique (Equation (1)). As shown in FIG. 6, according to the present embodiment, in a case of calculation of a high aspect ratio so that a plurality of times of reemissions is made, errors in the calculation of an indirect flux, especially errors in the calculation of a shape, can be decreased. Therefore, the same calculation accuracy as that calculated by the Monte Carlo method can be obtained.

Figure 7:
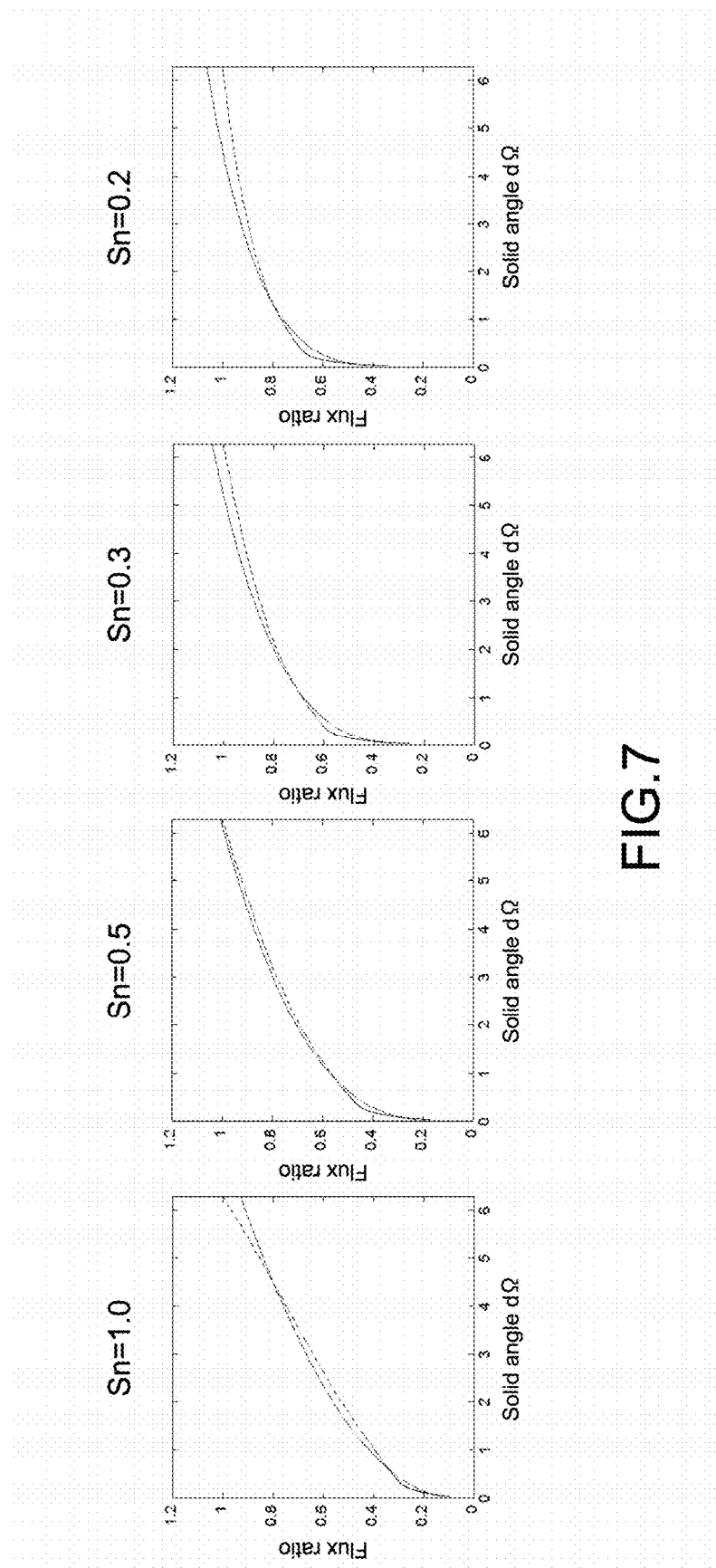
FIG. 7 is a diagram showing the comparison between the calculation result of the flux amount by the simulator method and the calculation result of the flux amount by the reference technique.

Meanwhile, FIG. 7 shows a comparison between the flux value calculated by Equation (6) and the value calculated by the Monte Carlo method when the surface reaction probabilities Sn are set to 1.0, 0.5, 0.3 and 0.2. A pattern shape is formed as a hole shape. In FIG. 7, a horizontal axis represents the solid angles ($d\Omega$), which corresponds to pattern depths. A horizontal axis represents flux ratios ($\Gamma(d\Omega, Sn)/\Gamma_n0$). In FIG. 7, broken lines represent the values calculated by the Monte Carlo method, and solid lines represent the values calculated by Equation (6). As shown in FIG. 7, according to the present embodiment, it can be seen that the results calculated by the Monte Carlo method can be reproduced properly. This suggests the pattern shape applies to a case other than the hole shape.

As described above, according to the present embodiment, the processing region of the wafer W is separated into a plurality of evaluation points E, and with respect to each of the evaluation points E, a calculation is made to obtain a total sum between the radical amount directly entering the evaluation point E from outside (plasma space S) and the radical amount reflecting on a surface of the processing target from outside and indirectly entering the evaluation point E. The above processing is executed repeatedly until a predetermined etching time ends, so that shape development and damage of the pattern P can be predicted.

[Simulation Method]

Figure 8:
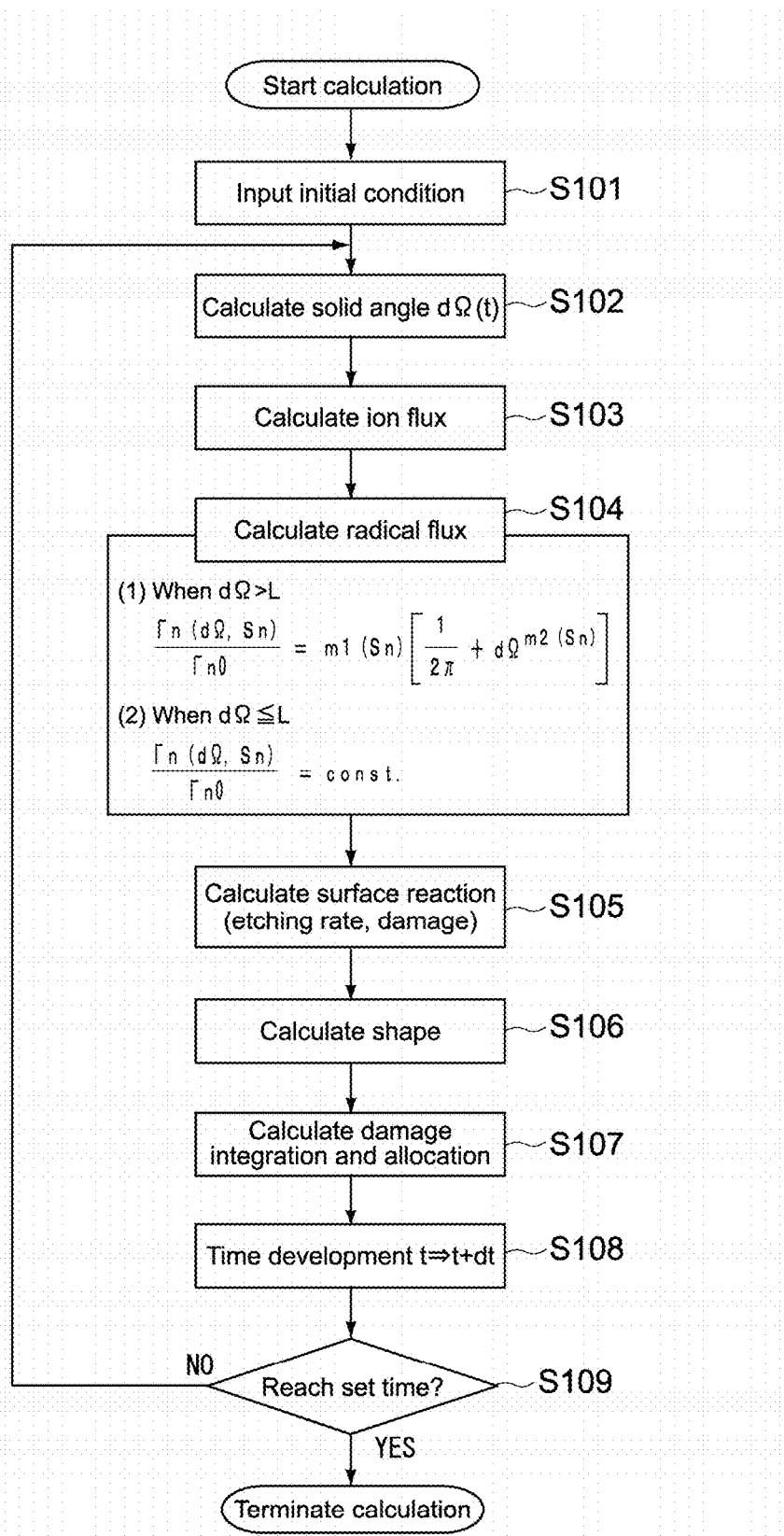
FIG. 8 is a flowchart describing the simulator method.

FIG. 8 is a flowchart describing an operation of the simulator 100.

After the start of calculation, an initial condition including a plasma condition, a process condition, a layout structure, mask information and the like which are necessary is inputted (step S101). The initial condition may be manually inputted by an operator or the necessary information may be automatically extracted from the previously inputted conditions.

Next, the simulator 100 uses the inputted initial condition to execute processing for respectively calculating a solid angle $d\Omega$ at an arbitrary evaluation point E and an ion flux and a radical flux entering the evaluation point E (steps S102 to S104).

In the calculation of the radical flux, as described above, two formulas (Equation (4) (or Equations (6) and (5)) are separately used depending on a size of the solid angle $d\Omega$. The simulator 100 uses these flux calculation values to solve a surface reaction equation, so that processing for calculating an etching rate (deposition rate in the case of plasma CVD), shape development, a damage integration and allocation, and the like is executed (steps S105 to S107). It should be noted that a method of calculating the ion flux, the etching rate (deposition rate), the shape development, the damage and the like is particularly limited, and a known calculation technique can be employed.

Subsequently, the simulator 100 moves time to a next time step (t+dt) and executes a processing for repeatedly performing the same calculation routine until a set calculation end time (steps S102 to S109).

The above described calculation technique enables predictions reflecting a real phenomenon at a high speed even in a pattern processing calculation of a high aspect ratio.

Calculation Example 1: Flux Calculation at Low Aspect Ratio

The calculation technique according to the present embodiment was used to obtain a radical flux at the time of a two-dimensional contact hole etching of $SiO_2$ film assuming a CCP (Capacitively Coupled Plasma) dry etching apparatus. A mask opening was formed in a circular shape, and its hole diameter (opening diameter) was set to 200 nm, and its mask thickness was set to 200 nm. The process condition was set as follows.

A plasma power source is not limited to the CCP, but other plasma power sources such as an ICP (Inductively Coupled Plasma) and an ECR (Electron Cyclotron Resonance) can be employed. Any types of processing apparatus can be used. Moreover, a mask pattern which can be calculated by the present technique is not limited to the above described example.

[Process Condition]

Type and flow rate of gas: $C_4F_8/O_2/Ar=11/8/400$ sccm
Pressure: 30 mTorr (3.99 Pa)
Vpp: 1450V
Wafer temperature: 30° C.

At this time, using the above described process conditions and gas flux data in a chamber obtained by plasma monitoring with use of OES (Optical Emission Spectroscopy), QMS (Quadrupole Mass Spectroscopy), and IRLAS (Infrared-diode Laser Absorption Spectroscopy), ions ($CF^+$, $CF_3^+$, $CF_2^+$, $C_2F_4^+$, $F^+$, $Ar^+$) and radicals ($CF_2$, CF, F, $CF_3$, O) entering immediately above the pattern were derived. This radical flux ($\Gamma_n 0$) was used to obtain a value of a flux ratio ($\Gamma/\Gamma_n 0$) at $d\Omega=2$ by Equation (4). At this time, values were set to m1=0.55, m2=0.3, and Sn=0.3. As a result of the calculation, $\Gamma/\Gamma_n 0$ was 0.77, and it was possible to reproduce, within an error of 4%, a value (0.80) calculated by the Monte Carlo method.

Calculation Example 2: Flux Calculation at High Aspect Ratio (when Pseudo-Convection Effect is Dominant)

In the same process condition and layout structure as the calculation example 1, a value of the flux ratio ($\Gamma/\Gamma_n 0$) was calculated at the solid angle $d\Omega=0.05$ by Equation (4). At this time, values were set to m1=0.58, m2=0.4, and Sn=0.5. As a result of the calculation, $\Gamma/\Gamma_n 0$ was 0.26, and it was possible to reproduce a value (0.23) calculated by the Monte Carlo method.

Calculation Example 3: Flux Calculation at High Aspect Ratio (when Pseudo-Stagnation Effect is Dominant)

In the same process condition and layout structure as the calculation example 1, a value of the flux ratio ($\Gamma/\Gamma_n 0$) was calculated at the solid angle $d\Omega=0.033$ by Equations (4) and (5). At this time, values were set to m1=0.58, m2=0.4, and Sn=0.5 (same as a value of L=0.03). As a result of the calculation, $\Gamma/\Gamma_n 0$ was 0.24, and it was possible to reproduce a value (0.19) calculated by the Monte Carlo method.

According to the present embodiment, the pattern shape is not limited to the hole shape. The reproduction can be made in any other pattern shape. Moreover, a processed film and the process condition are not limited to those described above. The effective surface reaction probability Sn may be constant all the time as an input initial condition or may have dependency with the time t. In this case, for example, the effective surface reaction Sn may be a function system depending on t or may be calculated from a ratio between the incident flux obtained by the immediately previous time step in each time step and a consumption flux in a surface reaction.

Calculation Example 4: Shape and Damage Calculation

Assuming $SiO_2$ contact hole processing which sets the process condition of the actual calculation example 1 (however, the etching time was set to 160 seconds) as an initial condition, a cell removal method was used to perform a two-dimensional processing simulation in accordance with a calculation flow in FIG. 8. In an initial pattern of the resist mask, hole diameters were set to 200 nm and 900 nm, and a film thickness was set to 400 nm. A cell was sized as 3 nm×3 nm. Herein, for example, a technique proposed in Japanese Patent Application No. 2012-146065 was used to derive a normal vector in a two-dimensional space from the immediately previous flux vector in the time step. With respect to the surface reaction, for example, a surface reaction model considering a depth direction (Japanese Patent Application No. 2010-284130) was used to compute the film thickness and the etching rate of a reaction deposition at a processing surface cell and calculate the shape development and the damage distribution in a direction of the normal vector.

Figure 9:
FIG. 9 is a diagram showing a comparison between a pattern shape obtained by the simulator method and an actual shape.

FIG. 9 shows a calculation result of the shape. FIG. 9 is an explanatory diagram showing a comparison between a cross-sectional SEM of an actual shape and a simulation result. It was possible to reproduce a tendency of depth of the processing and a shape characteristic seen in the cross-sectional SEM.

A shape development model is not limited to cell removal method, but other techniques such as a method of characteristics, a string method, a shock-tracking method, a level set method, and a ray-tracing model may be employed. Moreover, this can apply to not only the two-dimensional processing, but also a three-dimensional processing simulation.

As described above, according to the present embodiment, since the calculation method depending only on the solid angle $d\Omega$ and the effective surface reaction probability Sn is used, it is possible to predict the radical amount at a high speed and high precision by the flux method even at the high aspect ratio without being affected by a local shape (asperity). In addition, since the method of calculating the flux is less susceptible to the shape, it is possible to predict a stable shape and damage development without divergence and abnormality in the shape.

Moreover, a calculation load is low, so that introducing a simulation to a control system of the processing apparatus is more practical. Further, since the calculation load is low, a calculation to which ever-more parameters are allotted is quickly made, and effective process design, OPC (Optical Proximity Correction) design, or a layout design can be performed.

Second Embodiment

Next, a second embodiment of the present technology will be described. It should be noted that description similar to that of the above first embodiment will be appropriately omitted.

[Simulation Software]

Figure 10:
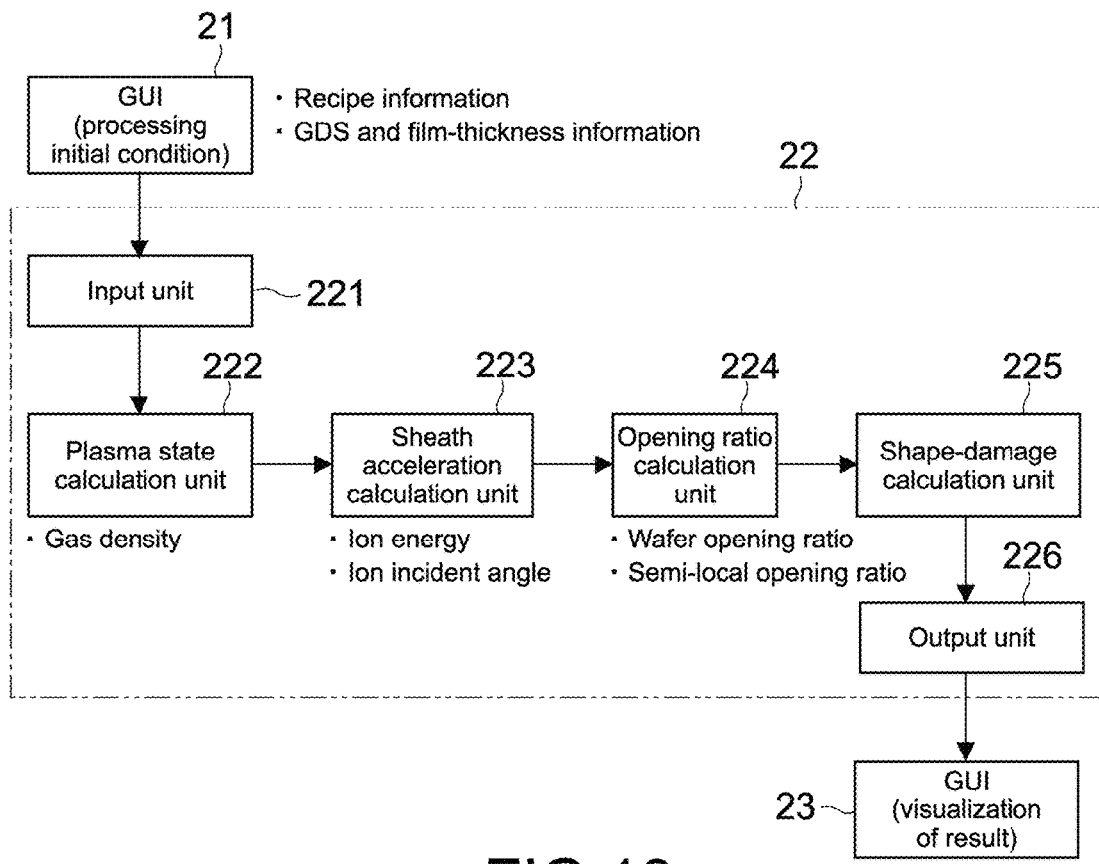
FIG. 10 is a functional block diagram of a simulation software described in a second embodiment of the present technology.

FIG. 10 is a functional block diagram explaining a simulation software (program) to which the simulation method according to the first embodiment is applied.

This simulation software includes a GUI (Graphical User Interface) 21 for inputting initial conditions, a calculation engine unit 22, and a GUI 123 for visualizing a simulation result.

The calculation engine unit 22 includes an input unit 221, a plasma state calculation unit 222, a sheath acceleration calculation unit 223, an opening ratio calculation unit 224, a shape-damage calculation unit 225, and an output unit 226. In this case, the input unit 221 configures the input unit 11 of the simulator 100. The plasma state calculation unit 222, the sheath acceleration calculation unit 223, the opening ratio calculation unit 224, and the shape-damage calculation unit 225 configure the calculation unit 12 of the simulator 100, and particularly, the shape-damage calculation unit 225 corresponds to the shape-damage calculation unit 13 of the simulator 100. The output unit 226 configures the output unit 14 of the simulator 100.

An executing platform of this simulation software may be any of, for example, Windows (registered trademark), Linux (registered trademark), Unix (registered trademark), and Mac (registered trademark). Moreover, the GUIs 21 and 23 may be applicable to any configuration language such as OpenGL, Motif, and tcl/tk. A programming language of the calculation engine unit 22 may be any type of programming language such as C, $C^{++}$, Fortran, and JAVA (registered trademark).

From the GUI 21, recipe information, apparatus information, parameters for calculation, GDS (Graphic Design System) data, and film thickness information are inputted as the initial conditions. The plasma state calculation unit 222 calculates density of each gas type (an ion and a radical) in bulk plasma based on the initial conditions. The sheath acceleration calculation unit 223 calculates an ion energy distribution function (IEDF) and an ion angular distribution function (IADF) with respect to a pattern as a final state of an ion that is generated in the bulk plasma and is accelerated (including collision with the radical) in a sheath. For these information, database obtained by, for example, actual measurement may be used.

The opening ratio calculation unit 224 calculates, based on the GDS data and the film thickness information, influence of a wafer opening ratio and a semi-local opening ratio (chip level opening ratio) on flux (that are in a linear relation). Based on these incident fluxes of the ion and of the radical, the shape-damage calculation unit 225 calculates a flux (ion, radical) and shape-damage distribution in accordance with the calculation flow shown in FIG. 8. Any method such as a string method, a level set method, a cell removal method may be used to shape development.

After the calculation is terminated, results of processing shape information such as a line width, a taper angle and a mask residual film, and damage distribution, a film thickness of reaction sediments (polymers and oxides) are outputted from the output unit 226 to a file. Moreover, these results can be also visualized by the GUI 123. The data may be outputted or visualized during the calculation in real time.

Third Embodiment

Next, a third embodiment of the present technology will be described. It should be noted that description similar to that of the above first embodiment will be appropriately omitted.

[Processing Apparatus]

Figure 11:
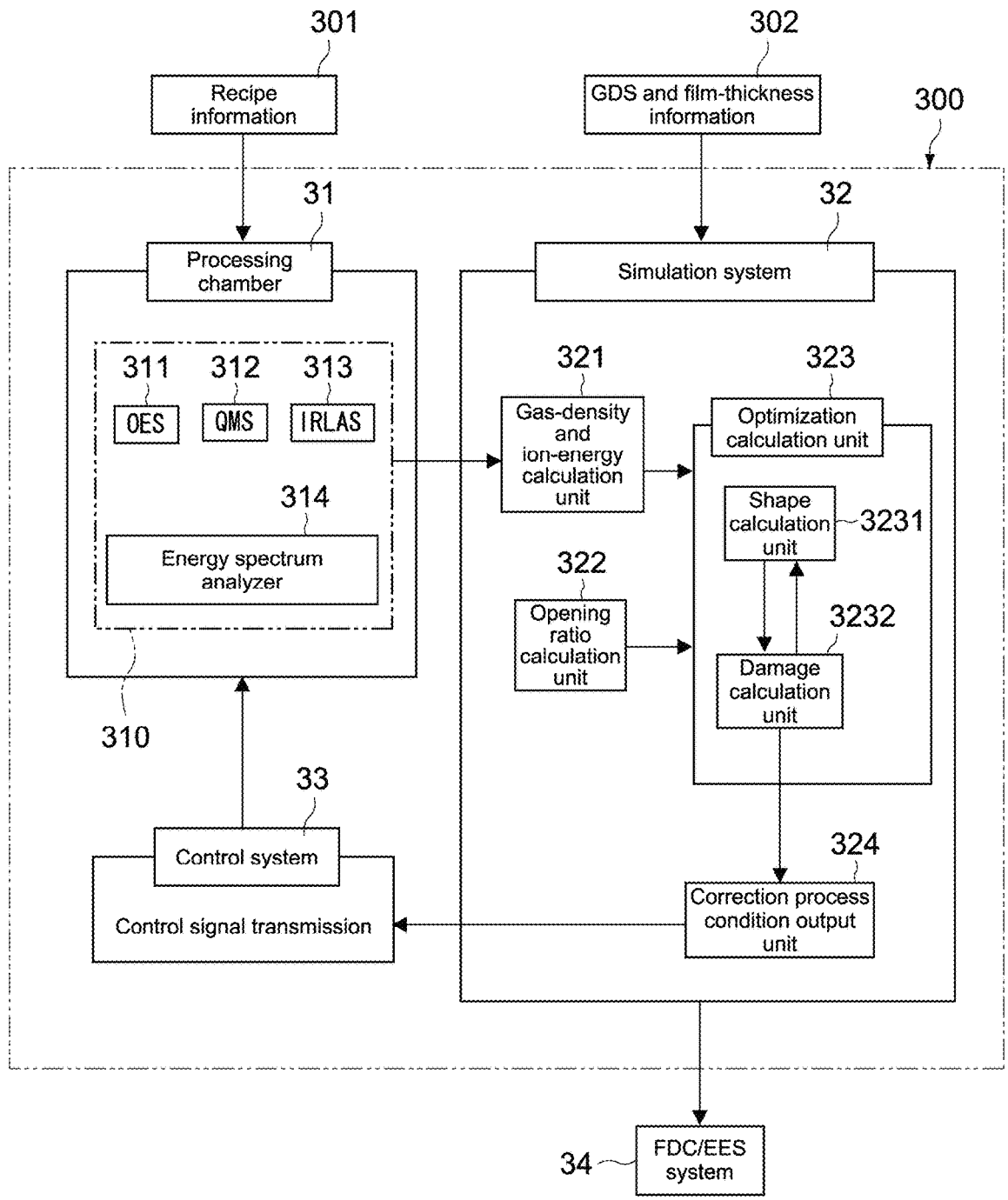
FIG. 11 is a block diagram showing a configuration example of a processing apparatus described in a third embodiment of the present technology.

FIG. 11 a block diagram showing a configuration of a semiconductor processing apparatus capable of real-time visualizing of shape-damage distribution to which the simulation method according to the first embodiment is applied.

A semiconductor processing apparatus 300 according to the present embodiment includes a processing chamber 31, a simulation system 32, a control system 33, and an FDC/EES system (Fault Detection and Classification/Equipment Engineering System) 34. The CCP is employed as the plasma power source of the processing chamber 31. Alternatively, the processing chamber 31 may be other plasma generating mechanism such as mechanisms of an ICP (Inductively Coupled Plasma) and an ECR (Electron Cyclotron Resonance).

The processing chamber 31 is configured as a processing unit which performs predetermined processing on a processing target (in this example, plasma etching process). The processing chamber 31 is implemented with a detecting unit 310 configured of an OES 311, a QMS 312, an IRLAS 313, and an energy spectrum analyzer 314 that are provided for acquiring input data necessary for the simulation, and a plasma state is continuously monitored during the processing by the detecting unit 310. The sampling rate is, for example, 0.1 seconds. Information acquired by the foregoing components during the processing and recipe information 301 is transferred to the simulation system 32, and gas density and ion energy are calculated. When the calculation time is sufficiently shorter than the actual processing time, all of the gas density and the ion energy may be determined by the reactor simulation.

The simulation system 32 is configured as a simulator simulating the predetermined processing in the processing chamber 31. The simulation system 32 includes a gas-density and ion-energy calculation unit 321, an opening ratio calculation unit 322, an optimization calculation unit 323, and a correction process condition output unit 324. The optimization calculation unit 323 includes a shape calculation unit 3231 and a damage calculation unit 3232. The simulation system 32 has a function or configuration substantially similar to that of the calculation engine unit 22 (FIG. 10) in the above described second embodiment.

The optimization calculation unit 323 takes into consideration the contribution to the flux of the wafer opening ratio and the semi-local opening ratio (chip level opening ratio) (that are in a linear relation) that are calculated by the opening ratio calculation unit 322 with use of the GDS and film-thickness information 302, and calculates the flux, the etching rate and the damage distribution in accordance with the calculation flow shown in FIG. 8. For example, the technique proposed in Japanese Patent Application No. 2012-146065 can be used for the mode deriving the etching rate and the damage. The correction process condition output unit 324 outputs, to the control unit 33, a correction signal of the processing condition generated based on the calculation result in the optimization calculation unit 323.

The control unit 33 is configured as a control unit controlling the processing chamber 31 based on the simulation result by the simulation system 32. The FDC/EES system 34 includes a management system configured to notify abnormality of the processing based on output of the simulation system 32.

When the shape and the damage are out of the desirable spec (for example, when a variation value of a line width is ±10% or more of a desirable value of 70 nm and a damage amount is increased by 50% of a desirable value of $10^{11}/cm^2$), process parameters is varied in order of a gas flow rate, gas pressure, application power, and wafer temperature, for example, by ±50% (this determination condition value is parameterized), and the calculation in FIG. 8 is performed. Thus, correction conditions that achieve the shape and the damage within the desirable spec are found. The correction conditions are transferred to the control system 33 through the correction process condition output unit 324. The control system 33 transmits, to the processing chamber 31, a control signal so that the processing chamber 31 satisfies the correction conditions. The processing chamber 31 changes the parameters relevant to the correction conditions and continues the processing. If a solution that satisfies the spec is not found in the simulation, an alert signal is transmitted to the FDC/EES system 34 and the apparatus is stopped thereby.

Concerning the optimization calculation part of the simulation system 32, when the calculation time has a scale equivalent to or larger than that of the actual processing time, an optimal solution may be found not by calculating shape and damage online as described above but by a method in which database of shape and damage with respect to various process conditions is prepared in advance and the optimal solution is searched and interpolated utilizing the database.

It should be noted that the calculation process in the simulation system 32 is not limited to the case where the calculation process is executed online or in real time, and may be executed offline.

Fourth Embodiment

Next, a fourth embodiment of the present technology will be described. It should be noted that description similar to that of the above first embodiment will be appropriately omitted.

[Design Method]

Figure 12:
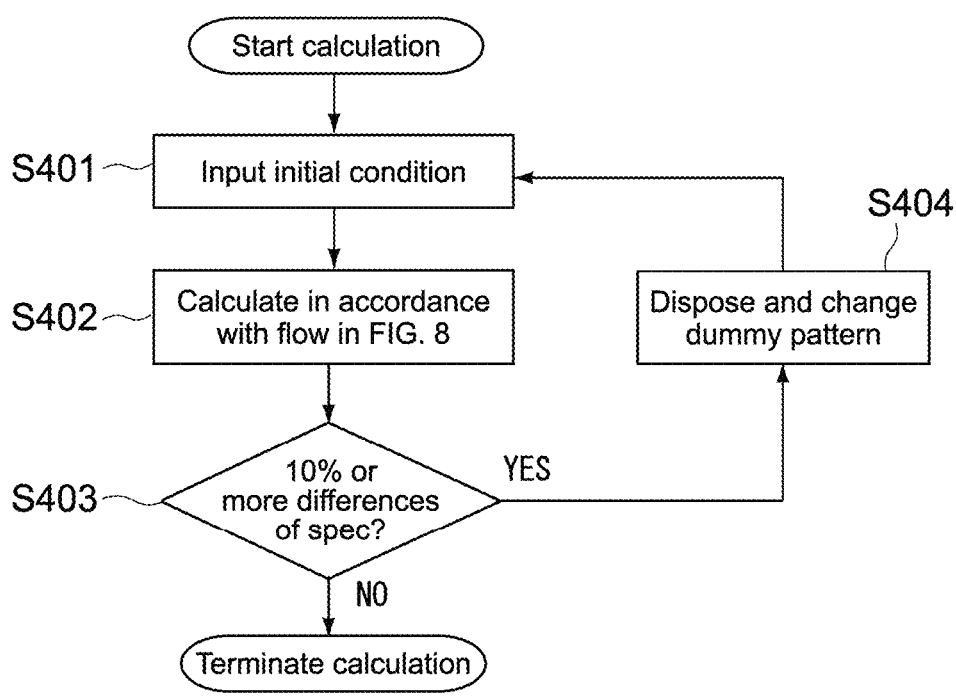
FIG. 12 is a flowchart of a design method described in a fourth embodiment of the present technology.

In the present embodiment, the simulator 100 and the simulation software described in the first and second embodiments are used to describe a design for optimizing a layout of a semiconductor device (in-chip layout). FIG. 12 shows a design flow.

As with the second embodiment, recipe information, apparatus information, parameters for calculation, GDS data, and film thickness information are inputted as the initial conditions through the GUI 21 (FIG. 10) (step S401). Subsequently, the simulator 100 executes a calculation process of the flux (ion, radical), the shape development and the like in accordance with the calculation flow shown in FIG. 8 (step S402).

Subsequently, the simulator 100 evaluates or determines whether a difference between the obtained shape and desirable spec is 10% or more (step S403). When the difference is 10% or more, a processing condition is changed to make the processing shape closer to the desirable spec. In the present embodiment, a dummy pattern (for example, a resist pattern) is disposed on the wafer, so that a radical amount entering a target pattern is adjusted (step S404). By executing the above processing repeatedly, the layout pattern is determined so that the difference between the obtained shape and desirable spec is suppressed to be equal to or less than a predetermined value (in this example, less than 10%).

Figure 13:
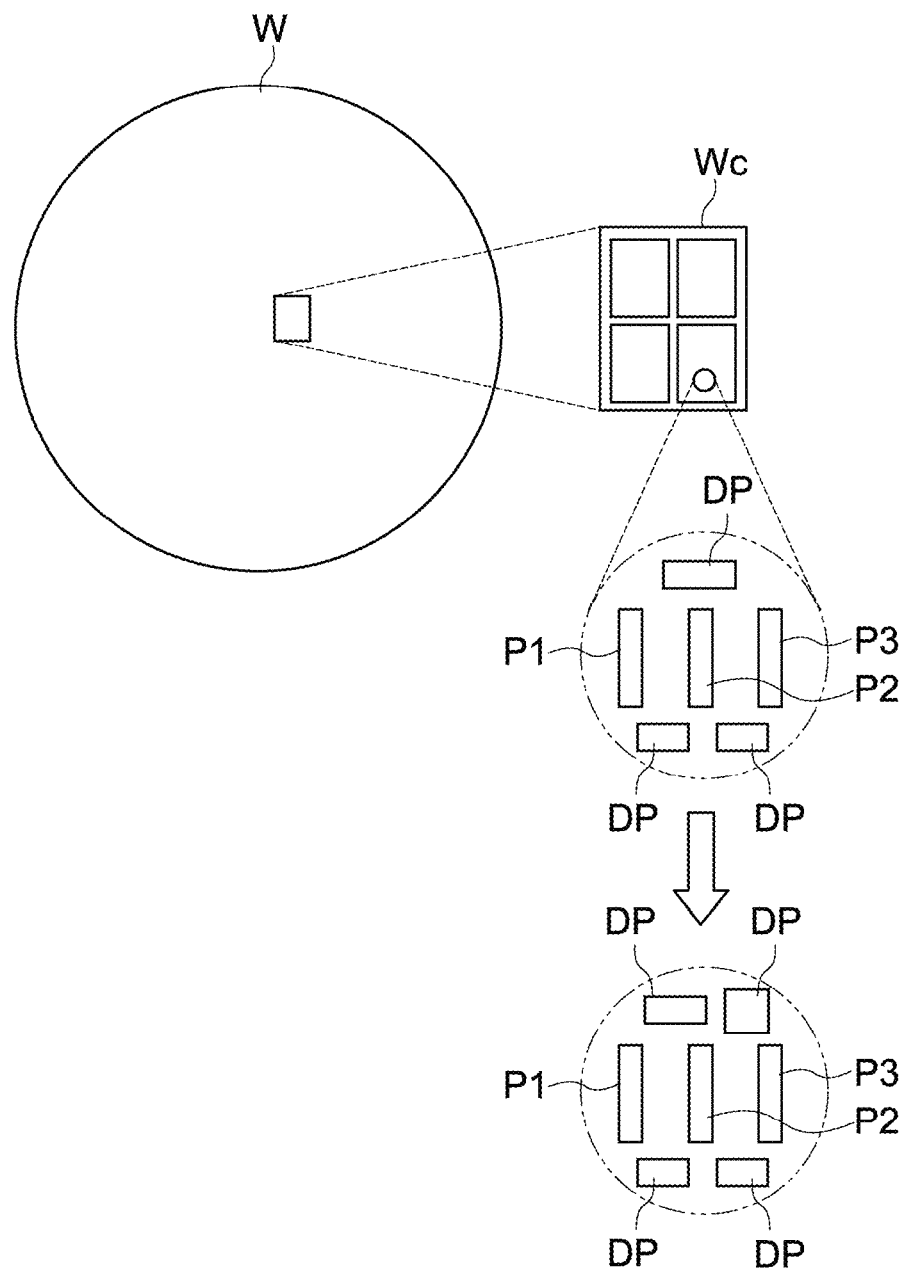
FIG. 13 is a schematic plan view of a processing target describing the design method.

FIG. 13 is schematic diagram showing an arrangement example of the dummy pattern. Of a plurality of patterns P1 to P3 provided on any one of chips We on the wafer W, for example, when the pattern P2 is targeted, it is assumed that a case where shape development is predicted. For example, when the processing condition is identical to the calculation example 1 described in the first embodiment and a spec of a hole processing conversion difference is 200 nm and the actually obtained processing conversion difference is 230 nm, dummy patterns DP covered with a resist mask are disposed around the pattern P2. In the process of designing the incident radical amount entering the pattern P2, a shape, size, and arrangement of the dummy patterns may be changed so that the incident radical amount entering the pattern P2 is optimal.

By disposing the dummy patterns DP and decreasing a chip level opening ratio, an amount that a reaction product from the resist mask enters the pattern P2 is increased, so that the processing conversion difference can be decreased. The dummy patterns are disposed so that the chip level opening ratio is 5% less, for example. The distance between the target pattern and the dummy pattern is not particularly limited, but is suitably set within several times of the mean free path of the reaction product, depending on a pressure condition of a process.

The design method according to the present embodiment is not limited to the above described examples, but can also be applied, for example, to determinations of the layout and shape of the target pattern or layouts of other patterns formed around the target pattern.

Further, according to the present embodiment, the design method can be applied to not only the layout design, but the process design including processing conditions such as a flow rate, pressure, a substrate temperature, a distance between electrodes, bias power or the OPC design including a mask shape (thickness, taper angel, line width, and opening ratio) and the like. For example, while considering the processing shape or damage predicted by the simulator 100, a processing recipe or a mask shape of the pattern can be optimized. In this case, the dummy patterns may be disposed or do not need to be disposed.

Although the foregoing are descriptions on embodiments of the present technology, the present technology is not limited to these embodiments and that various changes and modifications may be made in the technology without departing from the spirit and scope thereof.

For example, the above embodiments have described processing subjected to the processing target by taking plasma etching as an example, but is not limited thereto. The present technology can also be applied to various surface processing using plasma, for example, CVD (Chemical Vapor Deposition) or PVD (Physical Vapor Deposition).

Moreover, the processing target is limited to a silicon substrate, but may be other semiconductor substrates made of Ga—As and the like. The present technology can also be applied to the processing target constituted of other materials such as metal and plastic. Further, the processed film may be insulating films other than $SiO_2$ film, or may be a conductive film or other functional films.

It should be noted that the present technology may also be configured as follows.

(1) A simulation method, including: acquiring a processing condition for performing predetermined processing on a processing target with use of plasma; calculating a solid angle corresponding to a field-of-view region through which plasma space is viewable from a predetermined evaluation point in the predetermined evaluation point on a surface of the processing target based on the processing condition; and calculating an incident radical amount entering the evaluation point by a flux method with use of a function which takes a reaction probability between the solid angle and the evaluation point of a radical entering the evaluation point as an argument.

(2) The simulation method according to Item (1), in which the calculation of the incident radical amount calculates a total sum between a first radical amount directly entering the evaluation point from the plasma space and a second radical amount emitted from the surface of the processing target and entering the evaluation point.

(3) The simulation method according to Item (2), in which, in a case where the solid angle is equal to or less than a predetermined threshold value, the calculation of the incident radical amount calculates, as the incident radical amount, the radical amount obtained when the solid angle is the threshold value.

(4) The simulation method according to any one of Items (1) to (3), in which when the solid angle is $d\Omega$, the reaction probability is Sn, and the radical amount generated in the plasma space is $\Gamma_n 0$, in a case where $d\Omega > L$, an incident radical amount $\Gamma(d\Omega, Sn)$ in the evaluation point is calculated by an equation of $\Gamma(d\Omega, Sn)/\Gamma_n 0 = [d\Omega/(2\pi) + m1(Sn)d\Omega^{m2(Sn)}]$ using m1(Sn) and m2(Sn) as a parameter depending on the reaction probability.

(5) The simulation method according to any one of Items (1) to (4), in which when the solid angle is $d\Omega$, the reaction probability is Sn, and the radical amount generated in the plasma space is $\Gamma_n 0$, in a case where $d\Omega > L$, an incident radical amount $\Gamma(d\Omega, Sn)$ in the evaluation point is calculated by an equation of $\Gamma(d\Omega, Sn)/\Gamma_n 0 = m1(Sn)[d\Omega/(2\pi) + d\Omega^{m2(Sn)}]$ using m1(Sn) and m2(Sn) as a parameter depending on the reaction probability.

(6) The simulation method according to Item (4) or (5), in which in a case where $d\Omega \leq L$, the incident radical amount $\Gamma(d\Omega, Sn)$ in the evaluation point is kept constant at a value obtained when $d\Omega = L$.

It should be understood by those skilled in the art that various modifications, combinations, sub-combinations and alterations may occur depending on design requirements and other factors insofar as they are within the scope of the appended claims or the equivalents thereof.

What is claimed is:

1. A simulation method, comprising:
    acquiring, by input circuitry, a processing condition for performing predetermined processing on a processing target with use of plasma;
    calculating, by calculation circuitry, a solid angle corresponding to a field-of-view region through which plasma space is viewable from a respective predetermined evaluation point among a plurality of predetermined evaluation points on a surface of the processing target based on the processing condition; and
    calculating, by the calculation circuitry, an incident radical amount entering the respective predetermined evaluation point by a flux method with use of a function which takes a reaction probability between the solid angle and the respective predetermined evaluation point of a radical entering the respective predetermined evaluation point as an argument.

2. The simulation method according to claim 1, wherein the calculation of the incident radical amount includes calculation a total sum between a first radical amount directly entering the respective predetermined evaluation point from the plasma space and a second radical amount emitted from the surface of the processing target and entering the respective predetermined evaluation point.

3. The simulation method according to claim 2, wherein in a case where the solid angle is equal to or less than a predetermined threshold value, the calculation of the incident radical amount includes calculation, as the incident radical amount, a radical amount obtained when the solid angle is the threshold value.

4. The simulation method according to claim 1, wherein when the solid angle is $d\Omega$, the reaction probability is Sn, and the radical amount generated in the plasma space is $\Gamma_n 0$, in a case where $d\Omega > L$, an incident radical amount $\Gamma(d\Omega, Sn)$ in the respective predetermined evaluation point is calculated by an equation of $\Gamma(d\Omega, Sn)/\Gamma_n 0 = [d\Omega/(2\pi) + m1(Sn)d\Omega^{m2(Sn)}]$ using m1(Sn) and m2(Sn) as a parameter depending on the reaction probability.

5. The simulation method according to claim 4, wherein in a case where $d\Omega \leq L$, the incident radical amount $\Gamma(d\Omega, Sn)$ in the respective predetermined evaluation point is kept constant at a value obtained when $d\Omega = L$.

6. The simulation method according to claim 1, wherein when the solid angle is $d\Omega$, the reaction probability is Sn, and the radical amount generated in the plasma space is $\Gamma_n 0$, in a case where $d\Omega > L$, an incident radical amount $\Gamma(d\Omega, Sn)$ in the respective predetermined evaluation point is calculated by an equation of $\Gamma(d\Omega, Sn)/\Gamma_n 0 = m1$ (Sn)[dΩ/(2π)+dΩ$^{m2(Sn)}$] using m1(Sn) and m2(Sn) as a parameter depending on the reaction probability.

7. A non-transitory computer readable medium storing instructions that, when executed by an information processing apparatus, cause the information processing apparatus to execute calculation, the calculation comprising:
 calculating, by a calculation unit, a solid angle corresponding to a field-of-view region through which plasma space is viewable from a respective predetermined evaluation point among a plurality of predetermined evaluation points on a surface of a processing target based on a processing condition for performing predetermined processing on the processing target with use of plasma; and
 calculating, by the calculation unit, an incident radical amount entering the evaluation point by a flux method with use of a function which takes a reaction probability between the solid angle and the respective predetermined evaluation point of a radical entering the respective predetermined evaluation point as an argument.

8. The non-transitory computer readable medium according to claim 7, wherein
 the calculation of the incident radical amount includes calculation a total sum between a first radical amount directly entering the respective predetermined evaluation point from the plasma space and a second radical amount emitted from the surface of the processing target and entering the respective predetermined evaluation point.

9. The non-transitory computer readable medium according to claim 8, wherein
 in a case where the solid angle is equal to or less than a predetermined threshold value, the calculation of the incident radical amount includes calculation, as the incident radical amount, a radical amount obtained when the solid angle is the threshold value.

10. A processing apparatus, comprising:
 a processing unit configured to perform predetermined processing on a processing target with use of plasma;
 a detecting unit configured to monitor a plasma state in the processing unit;
 a simulator configured to simulate the predetermined processing; and
 a control unit configured to control the processing unit based on a simulation result by the simulator, the simulator including
  an input unit configured to acquire a processing condition for performing the predetermined processing,
  a calculation unit configured to calculate a solid angle corresponding to a field-of-view region through which plasma space is viewable from a respective predetermined evaluation point among a plurality of predetermined evaluation points on a surface of the processing target based on the processing condition, and calculate an incident radical amount entering the evaluation point by a flux method with use of a function which takes a reaction probability between the solid angle and the respective predetermined evaluation point of a radical entering the respective predetermined evaluation point as an argument, and
  an output unit configured to output, to the control unit, a correction signal of the processing condition generated based on the incident radical amount.

11. The processing apparatus according to claim 10, further comprising
 a management system configured to notify abnormality of the processing based on output of the simulator.

12. The processing apparatus according to claim 10, wherein
 the calculation of the incident radical amount includes calculation a total sum between a first radical amount directly entering the respective predetermined evaluation point from the plasma space and a second radical amount emitted from the surface of the processing target and entering the respective predetermined evaluation point.

13. The processing apparatus according to claim 12, wherein
 in a case where the solid angle is equal to or less than a predetermined threshold value, the calculation of the incident radical amount includes calculation, as the incident radical amount, a radical amount obtained when the solid angle is the threshold value.

14. A simulator, comprising:
 input circuitry configured to acquire a processing condition for performing predetermined processing on a processing target with use of plasma; and
 calculation circuitry configured to calculate a solid angle corresponding to a field-of-view region through which plasma space is viewable from a respective predetermined evaluation point among a plurality of predetermined evaluation points on a surface of the processing target based on the processing condition, and calculate an incident radical amount entering the evaluation point by a flux method with use of a function which takes a reaction probability between the solid angle and the respective predetermined evaluation point of a radical entering the respective predetermined evaluation point as an argument.

15. The simulator according to claim 14, wherein
 the calculation of the incident radical amount includes calculation a total sum between a first radical amount directly entering the respective predetermined evaluation point from the plasma space and a second radical amount emitted from the surface of the processing target and entering the respective predetermined evaluation point.

16. The simulator according to claim 15, wherein
 in a case where the solid angle is equal to or less than a predetermined threshold value, the calculation of the incident radical amount includes calculation, as the incident radical amount, a radical amount obtained when the solid angle is the threshold value.

17. A design method, comprising:
 acquiring, by input circuitry, a processing condition for performing predetermined processing on a processing target with use of plasma;
 calculating, by calculation circuitry, a solid angle corresponding to a field-of-view region through which plasma space is viewable from a respective predetermined evaluation point among a plurality of predetermined evaluation points on a surface of the processing target based on the processing condition;
 calculating, by the calculation circuitry, an incident radical amount entering the evaluation point by a flux method with use of a function which takes a reaction probability between the solid angle and the respective predetermined evaluation point of a radical entering the respective predetermined evaluation point as an argument;
 evaluating, by the calculation circuitry, a processing shape predicted based on the incident radical amount; and changing, by the calculation circuitry, at least one of the processing condition and a layout in a chip based on an evaluation result of the processing shape.

18. The design method according to claim 17, wherein the calculation of the incident radical amount includes calculation a total sum between a first radical amount directly entering the respective predetermined evaluation point from the plasma space and a second radical amount emitted from the surface of the processing target and entering the respective predetermined evaluation point.

19. The design method according to claim 18, wherein in a case where the solid angle is equal to or less than a predetermined threshold value, the calculation of the incident radical amount includes calculation, as the incident radical amount, a radical amount obtained when the solid angle is the threshold value.

* * * * *